US012593420B2

(12) United States Patent (10) Patent No.: US 12,593,420 B2
Chen et al. (45) Date of Patent: Mar. 31, 2026

(54) SLIDE RAIL ASSEMBLY

(71) Applicants: King Slide Works Co., Ltd.,
Kaohsiung City (TW); **King Slide
Technology Co., Ltd.,** Kaohsiung City
(TW)

(72) Inventors: Ken-Ching Chen, Kaohsiung City
(TW); Shun-Ho Yang, Kaohsiung City
(TW); Chien-Li Huang, Kaohsiung
City (TW); Chun-Chiang Wang,
Kaohsiung City (TW)

(73) Assignees: King Slide Works Co., Ltd.,
Kaohsiung City (TW); **King Slide
Technology Co., Ltd.,** Kaohsiung City
(TW)

( * ) Notice: Subject to any disclaimer, the term of this
patent is extended or adjusted under 35
U.S.C. 154(b) by 291 days.

(21) Appl. No.: 18/335,242

(22) Filed: Jun. 15, 2023

(65) Prior Publication Data

US 2024/0244787 A1     Jul. 18, 2024

(30) Foreign Application Priority Data

Jan. 13, 2023     (TW) ................................. 112101920

(51) Int. Cl.
*H05K 7/14* (2006.01)
*H05K 7/18* (2006.01)

(52) U.S. Cl.
CPC ........... *H05K 7/1489* (2013.01); *H05K 7/183*
(2013.01)

(58) Field of Classification Search
CPC ............................. H05K 7/1489; H05K 7/183
See application file for complete search history.

(56) References Cited

U.S. PATENT DOCUMENTS

| | | | | |
|---|---|---|---|---|
| 7,404,611 | B1 * | 7/2008 | Que | A47B 88/493 |
| | | | | 312/334.46 |
| 9,572,277 | B2 | 2/2017 | Chen et al. | |
| 10,736,422 | B2 * | 8/2020 | Chen | A47B 88/49 |
| 11,064,807 | B2 * | 7/2021 | Chen | A47B 96/06 |
| 12,220,055 | B2 * | 2/2025 | Chen | A47B 88/447 |
| 12,268,301 | B2 * | 4/2025 | Chen | A47B 88/447 |
| 12,290,170 | B2 * | 5/2025 | Chen | H05K 7/1489 |
| 2020/0107636 | A1 * | 4/2020 | Chen | H05K 7/183 |
| 2020/0337462 | A1 | 10/2020 | Chen et al. | |

FOREIGN PATENT DOCUMENTS

CN            109618527  A      4/2019

* cited by examiner

*Primary Examiner* — Eret C McNichols
(74) *Attorney, Agent, or Firm* — Best & Flanagan LLP

(57) ABSTRACT

A slide rail assembly includes a first rail, a second rail, a
third rail, a fourth rail and a fifth rail. The second rail and the
third rail are respectively movable relative to the first rail.
Each of the second rail and the third rail is formed with a
passage. The fourth rail and the fifth rail are configured to be
accommodated in the passages of the second rail and the
third rail respectively.

12 Claims, 8 Drawing Sheets

SLIDE RAIL ASSEMBLY

BACKGROUND OF THE INVENTION

1. Field of the Invention

The present invention relates to a slide rail mechanism, and more particularly, to a slide rail assembly comprising a plurality of slide rails with a special structural configuration.

2. Description of the Prior Art

U.S. Pat. No. 9,572,277 B2 (hereinafter referred to as Patent '277) discloses a slide rail assembly, which includes a first rail, a second rail, a third rail and an extension rail. The second rail is movable relative to the first rail. The third rail and the extension rail are respectively mounted with a first chassis and a second chassis. When the third rail and the extension rail are moved to predetermined positions, the third rail and the extension rail can be separated from each other, such that the difficulty in removing wires and replacing components due to complicated wiring and narrow space inside the server chassis and its storage device can be overcome.

In the embodiment of Patent '277, the third rail is movably mounted to a first rail section (such as a rear rail section) of the second rail, and the extension rail is fixedly mounted to a second rail section (such as a front rail section) of the second rail. Since the extension rail is fixed to the second rail, the second chassis cannot be detached from the second rail. Moreover, since the first chassis mounted on the third rail is configured to be blocked by the second chassis, the first chassis cannot be detached from the second rail along an opening direction.

However, in order to meet diverse requirements of the market, it is important to develop various slide rail products.

SUMMARY OF THE INVENTION

The present invention provides a slide rail assembly comprising a plurality of slid rails with a special structural configuration.

According to an embodiment of the present invention, a slide rail assembly comprises a first rail, a second rail, a third rail, a fourth rail and a fifth rail. The first rail is formed with a first passage. The second rail and the third rail are movably mounted in the first passage of the first rail, and the second rail and the third rail are formed with a second passage and a third passage respectively. The fourth rail and the fifth rail are movably mounted in the second passage of the second rail and the third passage of the third rail respectively.

According to another embodiment of the present invention, a slide rail assembly comprises a first rail, a second rail, a third rail, a fourth rail and a fifth rail. The second rail and the third rail are respectively movable relative to the first rail. Each of the second rail and the third rail is formed with a passage. The passage of the second rail is communicated and aligned with the passage of the third rail. The fourth rail and the fifth rail are configured to be accommodated in the passage of the second rail and the passage of the third rail respectively.

According to another embodiment of the present invention, a slide rail assembly comprises an outer rail and two inner rails. The outer rail is configured to be mounted to a rack. The rack has a front end and a rear end. The two inner rails are movable relative to the outer rail. The two inner rails have different lengths. A first one of the two inner rails is configured to carry a first carried object, and a second one of the two inner rails is configured to carry a second carried object. When the first one of the two inner rails is located at a first predetermined extended position relative to the outer rail, the first carried object is at least partially extended beyond the front end of the rack. When the first one of the two inner rails is moved from the first predetermined extended position relative to the outer rail along an opening direction to be detached, the second one of the two inner rails is movable relative to the outer rail along the opening direction to a second predetermined extended position. When the second one of the two inner rails is located at the second predetermined extended position, the second carried object is at least partially extended beyond the front end of the rack.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
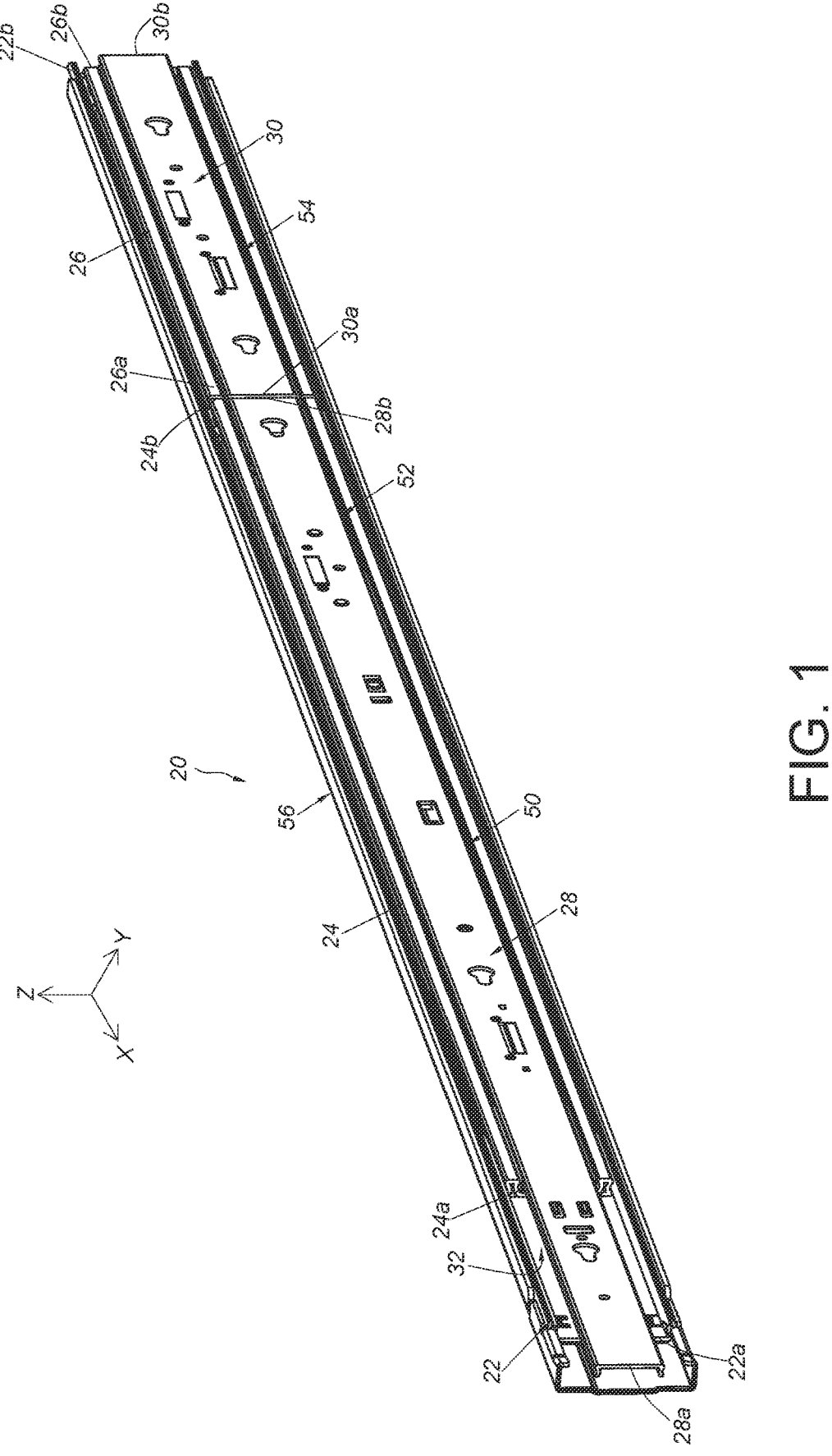
FIG. 1 is diagram showing a slide rail assembly according to a first embodiment of the present invention.
Figure 2:
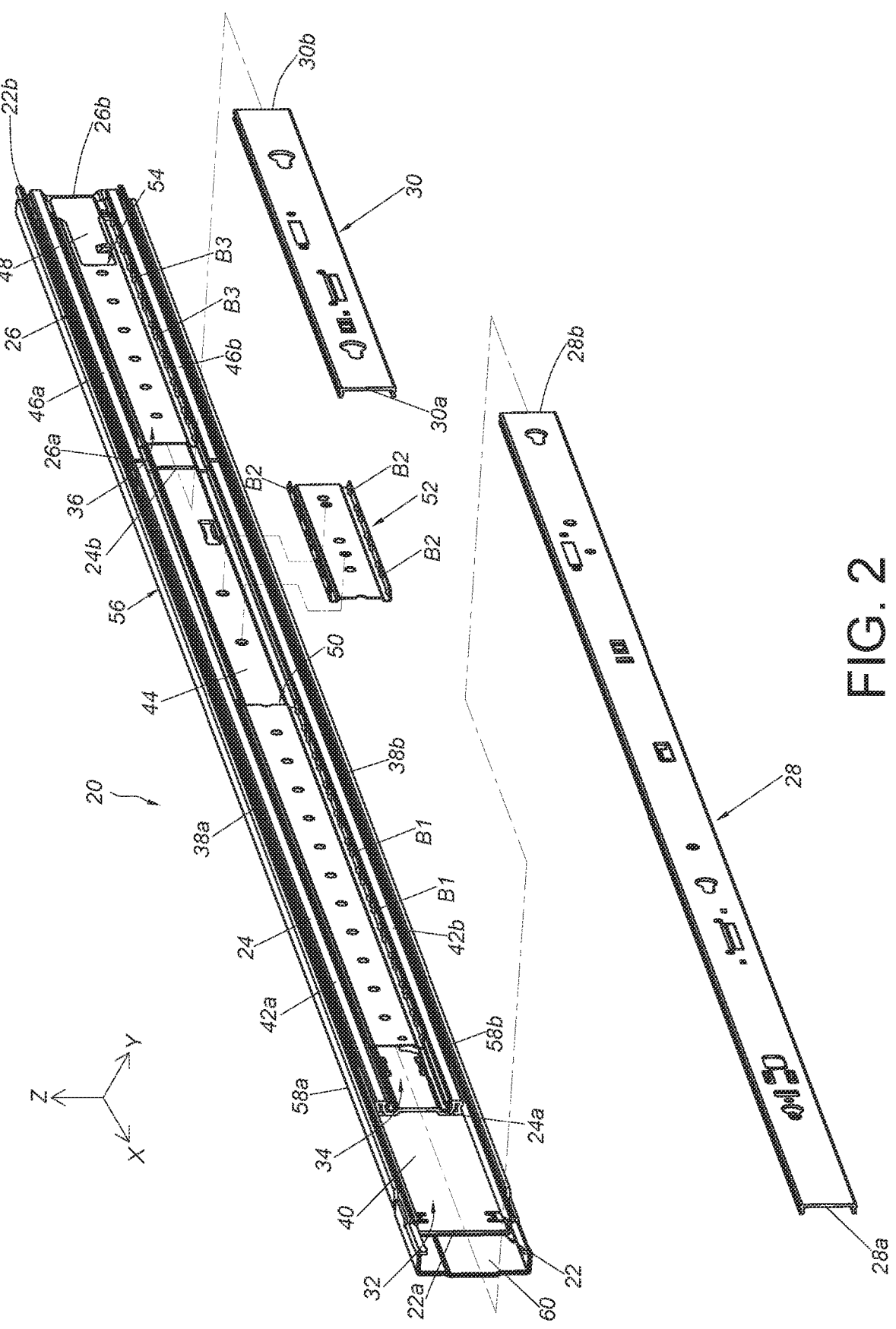
FIG. 2 is an exploded view of the slide rail assembly according to the first embodiment of the present invention.

As shown in FIG. 1 and FIG. 2, a slide rail assembly 20 includes a plurality of slide rails that are longitudinally movable relative to each other according to first embodiment of the present invention. In the present embodiment, the slide rail assembly 20 includes a first rail 22, a second rail 24, a third rail 26, a fourth rail 28 and a fifth rail 30. In the present embodiment, the X-axis is a longitudinal direction (or a length direction or a moving direction of the slide rail), the Y-axis is a transverse direction (or a lateral direction of the slide rail), and the Z-axis is a vertical direction (or a height direction of the slide rail). In addition, each of the slide rails 22, 24, 26, 28, 30 has a front part and a rear part. For example, the first rail 22 has a front part 22a and a rear part 22b; the second rail 24 has a front part 24a and a rear part 24*b*; the third rail 26 has a front part 26*a* and a rear part 26*b*; the fourth rail 28 has a front part 28*a* and a rear part 28*b*; and the fifth rail 30 has a front part 30*a* and a rear part 30*b*.

Moreover, the first rail 22 is formed with a first passage 32. The second rail 24 and the third rail 26 are movably mounted in the first passage 32 of the first rail 22. The second rail 24 and the third rail 26 are respectively formed with a second passage 34 and a third passage 36. The fourth rail 28 and the fifth rail 30 are configured to be accommodated in the second passage 34 of the second rail 24 and the third passage 36 of the third rail 26 respectively. For example, the fourth rail 28 and the fifth rail 30 can be movably mounted in the second passage 34 of the second rail 24 and the third passage 36 of the third rail 26 respectively. The second passage 34 and the third passage 36 are communicated and aligned with each other. In other words, the fourth rail 28 and the fifth rail 30 are movable on a same longitudinal path.

Preferably, the first rail 22 comprises a first wall 38*a*, a second wall 38*b* and a longitudinal wall 40 connected between the first wall 38*a* and the second wall 38*b* of the first rail 22. The first passage 32 is defined by the first wall 38*a*, the second wall 38*b* and the longitudinal wall 40 of the first rail 22 and configured to accommodate the second rail 24 and the third rail 26.

Preferably, the second rail 24 comprises a first wall 42*a*, a second wall 42*b* and a longitudinal wall 44 connected between the first wall 42*a* and the second wall 42*b* of the second rail 24. The second passage 34 is defined by the first wall 42*a*, the second wall 42*b* and the longitudinal wall 44 of the second rail 24 and configured to accommodate the fourth rail 28.

Preferably, the third rail 26 comprises a first wall 46*a*, a second wall 46*b* and a longitudinal wall 48 connected between the first wall 46*a* and the second wall 46*b* of the third rail 26. The third passage 36 is defined by the first wall 46*a*, the second wall 46*b* and the longitudinal wall 48 of the third rail 26 and configured to accommodate the fifth rail 30.

Preferably, the slide rail assembly 20 further comprises a first slide assisting device 50 movably mounted in the second passage 34 of the second rail 24, and the first slide assisting device 50 is adjacent to a front rail section of the second rail 24. The first slide assisting device 50 is configured to improve smoothness of relative movement between the second rail 24 and the fourth rail 28. The first slide assisting device 50 comprises a plurality of first rolling balls B1 configured to be supported between the second rail 24 and the fourth rail 28.

Preferably, the slide rail assembly 20 further comprises a second slide assisting device 52 arranged in the second passage 34 of the second rail 24. In the present embodiment, the second slide assisting device 52 is fixedly connected to the second rail 24 (the longitudinal wall 44 of the second rail 24), but the present invention is not limited thereto. In contrast to the first slide assisting device 50, the second slide assisting device 52 is adjacent to a rear rail section of the second rail 24, and the second slide assisting device 52 is configured to improve smoothness of relative movement between the second rail 24 and the fourth rail 28. The second slide assisting device 52 comprises a plurality of second rolling balls B2 configured to be supported between the second rail 24 and the fourth rail 28.

Preferably, the slide rail assembly 20 further comprises a third slide assisting device 54 movably mounted in the third passage 36 of the third rail 26. The third slide assisting device 54 is configured to improve smoothness of relative movement between the third rail 26 and the fifth rail 30. The third slide assisting device 54 comprises a plurality of third rolling balls B3 configured to be supported between the third rail 26 and the fifth rail 28.

Preferably, the second rail 24 and the third rail 26 have different longitudinal lengths. In the present embodiment, the second rail 24 is longer than the third rail 26, but the present invention is not limited thereto.

Preferably, the fourth rail 28 and the fifth rail 30 have different longitudinal lengths. In the present embodiment, the fourth rail 28 is longer than the fifth rail 30, but the present invention is not limited thereto.

Preferably, the slide rail assembly 20 further comprises a bracket 56 connected (such as fixedly connected) to one side of the longitudinal wall 40 of the first rail 22 opposite to the second rail 24 and the third rail 26. For example, the bracket 56 is connected to a back side of the longitudinal wall 40 of the first rail 22.

Preferably, the bracket 56 comprises a first wall 58*a*, a second wall 58*b* and a longitudinal wall 60 connected between the first wall 58*a* and the second wall 58*b* of the bracket 56, and the first wall 58*a*, the second wall 58*b* and the longitudinal wall 60 of the bracket 56 are configured to cover a portion of the first wall 38*a*, the second wall 38*b* and the longitudinal wall 40 of the first rail 22 respectively.

Figure 3:
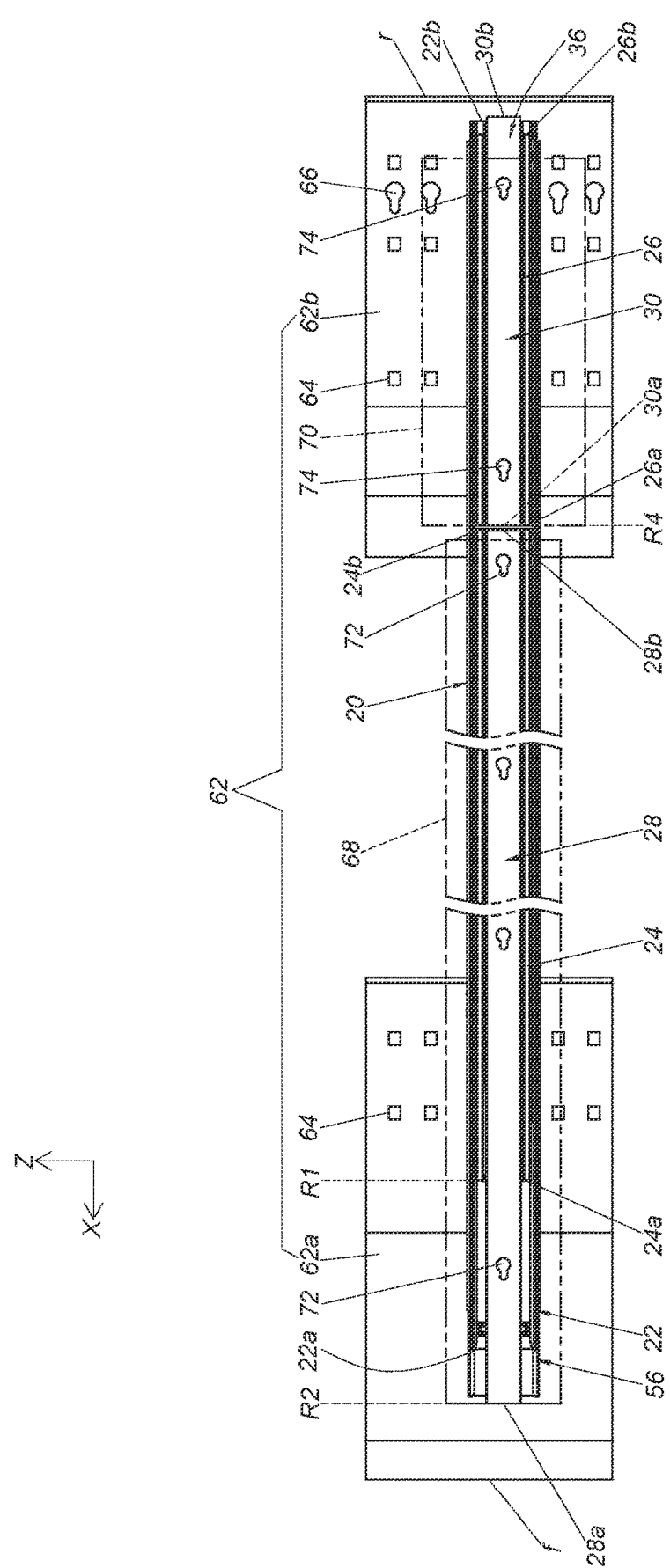
FIG. 3 is a diagram showing the slide rail assembly being mounted to a rack according to the first embodiment of the present invention.

As shown in FIG. 3, the first rail 22 is configured to be mounted to a rack 62 (or post). For example, the first rail 22 is configured to be mounted to a front part 62*a* and a rear part 62*b* of the rack 62. In the present embodiment, the first rail 22 is mounted to the front part 62*a* and the rear part 62*b* of the rack 62 through the bracket 56. In addition, the rack 62 has a front end f and a rear end r.

The rack 62 has a plurality of mounting features, such as a plurality of first mounting features 64 and a plurality of second mounting features 66, configured to mount the bracket 56. Such configuration is well known to those skilled in the art, for simplification, no further illustration is provided. On the other hand, the fourth rail 28 is configured to carry a first carried object 68, and the fifth rail 30 is configured to carry a second carried object 70. For example, the fourth rail 28 comprises at least one first connecting feature 72 configured to mount the first carried object 68, and the fifth rail 30 comprises at least one second connecting feature 74 configured to mount the second carried object 70. Each of the first carried object 68 and the second carried object 70 can be a chassis, an electronic device, a drawer or the like, but the present invention is not limited thereto. Moreover, the fourth rail 28 and the fifth rail 30 have different longitudinal lengths, such that the fourth rail 28 and the fifth rail 30 are configured to carry the carried objects with different longitudinal lengths respectively. In the present embodiment, the first carried object 68 is longer than the second carried object 70.

Furthermore, the slide rail assembly 20 is in a retracted state as shown in FIG. 3. In such state, both of the second rail 24 and the third rail 26 are retracted relative to the first rail 22, and the fourth rail 28 and the fifth rail 30 are respectively retracted relative to the second rail 24 and the third rail 26. The fourth rail 28 (and the first carried object 68) is located inside the rack 62. For example, the fourth rail 28 (and the first carried object 68) is not extended beyond the front end f of the rack 62. The fifth rail 30 (and the second carried object 70) is also located inside the rack 62, and the second carried object 70 is located behind the first carried object 68.

Figure 4:
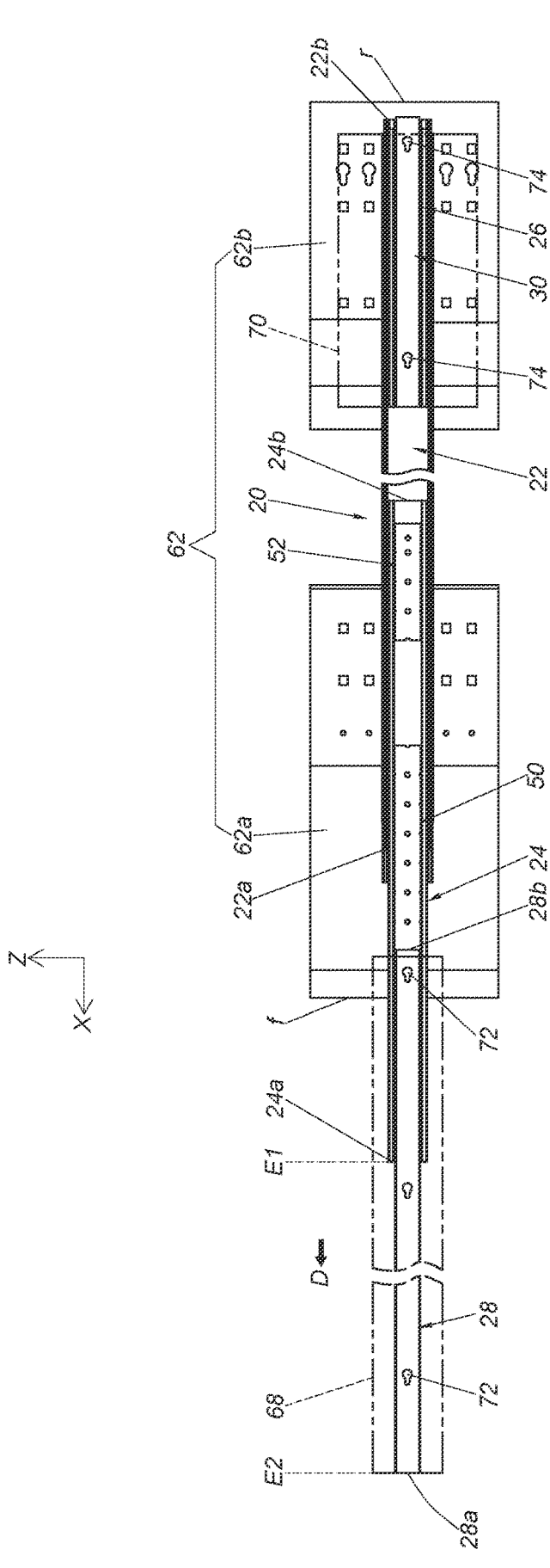
FIG. 4 is a diagram showing the slide rail assembly being mounted to the rack with a first carried object being opened relative to the rack through slide rails of the slide rail assembly according to the first embodiment of the present invention.

As shown in FIG. 4, the second rail 24 and the fourth rail 28 are in an extended state relative to the first rail 22.

Furthermore, the second rail 24 is movable relative to the first rail 22 from a first retracted position R1 (as shown in FIG. 3) along an opening direction D to a first extended position E1 (as shown in FIG. 4), and the fourth rail 28 is movable relative to the second rail 24 from a second retracted position R2 (as shown in FIG. 3) along the opening direction D to a second extended position E2 (as shown in FIG. 4). In the state of FIG. 4, the fourth rail 28 (and the first carried object 68) is at least partially extended beyond the front end f of the rack 62, or the fourth rail 28 (and the first carried object 68) is located outside the rack 62, such that it is convenient for a user to perform maintenance on the first carried object 68. When the fourth rail 28 is located at the second extended position E2, the front part 28*a* of the fourth rail 28 is extended beyond the front part 22*a* of the first rail 22, and the front part 28*a* of the fourth rail 28 is also extended beyond the front end f of the rack 62 (as shown in FIG. 4). Similarly, when the second rail 24 is located at the first extended position E1 relative to the first rail 22, the front part 24*a* of the second rail 24 is extended beyond the front part 22*a* of the first rail 22, and the front part 24*a* of the second rail 24 is also extended beyond the front end f of the rack 62 (as shown in FIG. 4).

Figure 5:
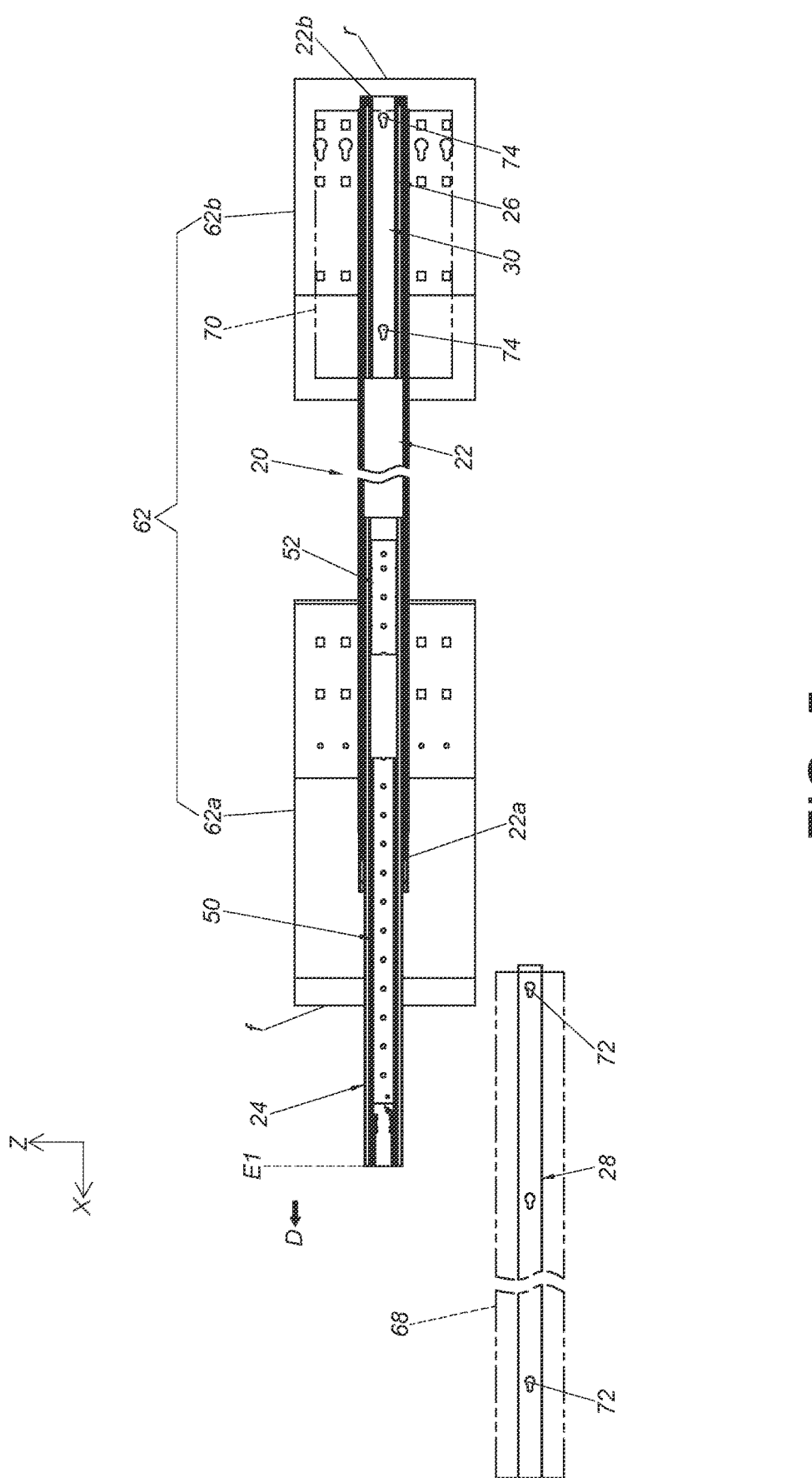
FIG. 5 is a diagram showing the slide rail assembly being mounted to the rack with the first carried object being detached from the rack according to the first embodiment of the present invention.

As shown in FIG. 5, the fourth rail 28 and the first carried object 68 can be moved relative to the second rail 24 from the second extended position E2 along the opening direction D to be detached.

Figure 6:
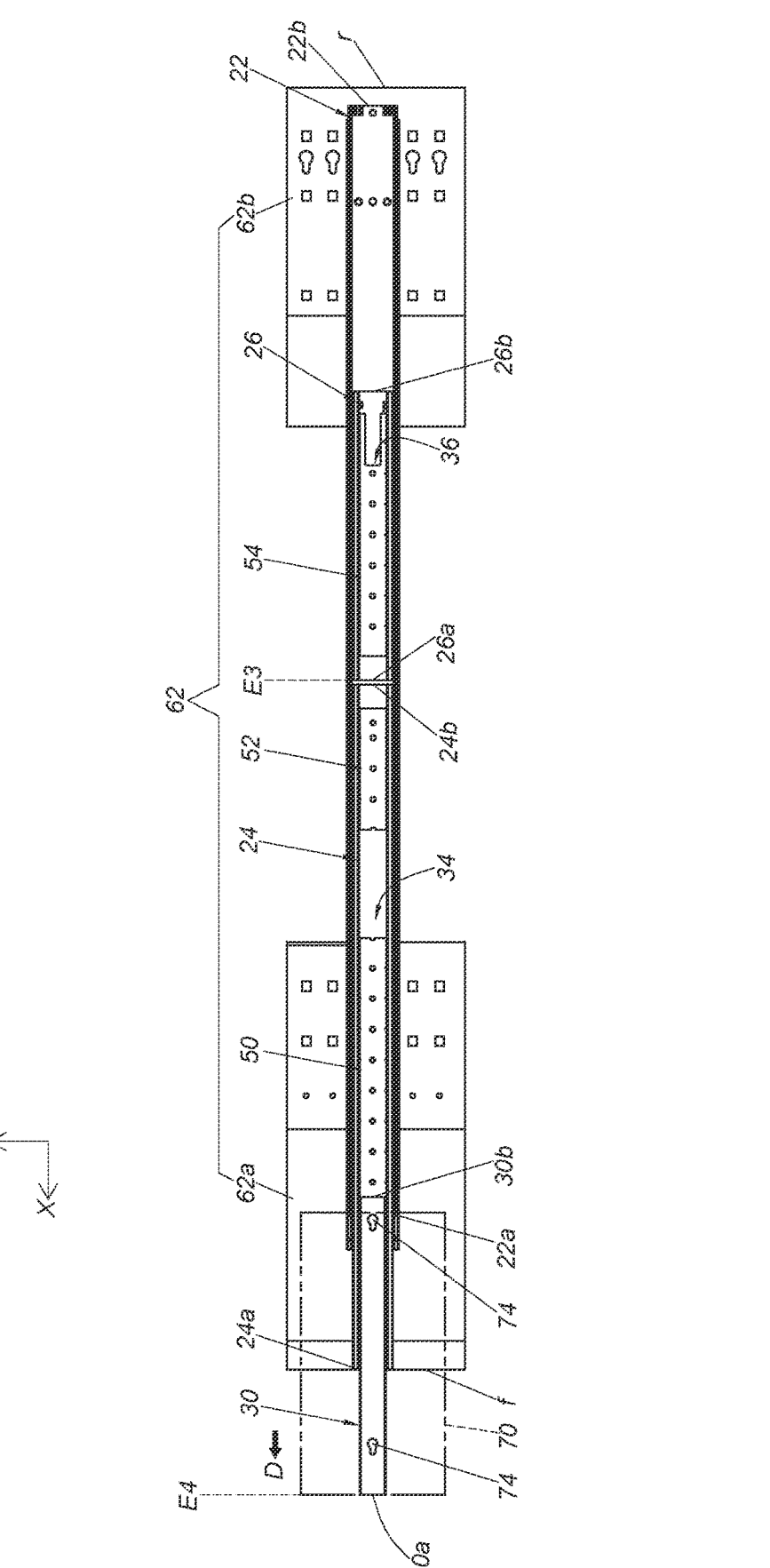
FIG. 6 is a diagram showing the slide rail assembly being mounted to the rack with a second carried object being opened relative to the rack through the slide rails of the slide rail assembly according to the first embodiment of the present invention.

Please refer to FIG. 6, and refer to FIG. 3 as well. When the fourth rail 28 and the first carried object 68 are moved from the second extended position E2 along the opening direction D to be detached, the third rail 26 is movable relative to the first rail 22 from a third retracted position (as shown in FIG. 3) along the opening direction D to a third extended position E3 (as shown in FIG. 6), and the fifth rail 30 in the third passage 36 of the third rail 26 is movable relative to the third rail 26 from a fourth retracted position R4 (as shown in FIG. 3) along the opening direction D to pass through the second passage 34 of the second rail 24 to reach a fourth extended position E4 (as shown in FIG. 6). In such state, the fifth rail 30 (and the second carried object 70) is at least partially extended beyond the front end f of the rack 62, or the fifth rail 30 (and the second carried object 70) is located outside the rack 62, such that it is convenient for the user to perform related maintenance operation on the second carried object 70. When the fifth rail 30 is located at the fourth extended position E4, the front part 30*a* of the fifth rail 30 is extended beyond the front part 22*a* of the first rail 22, and the front part 30*a* of the fifth rail 30 is also extended beyond the front end f of the rack 62. Preferably, the fifth rail 30 can be further moved relative to the third rail 26 and the second rail 24 from the fourth extended position E4 along the opening direction D to be detached (not shown in figures).

Figure 7:
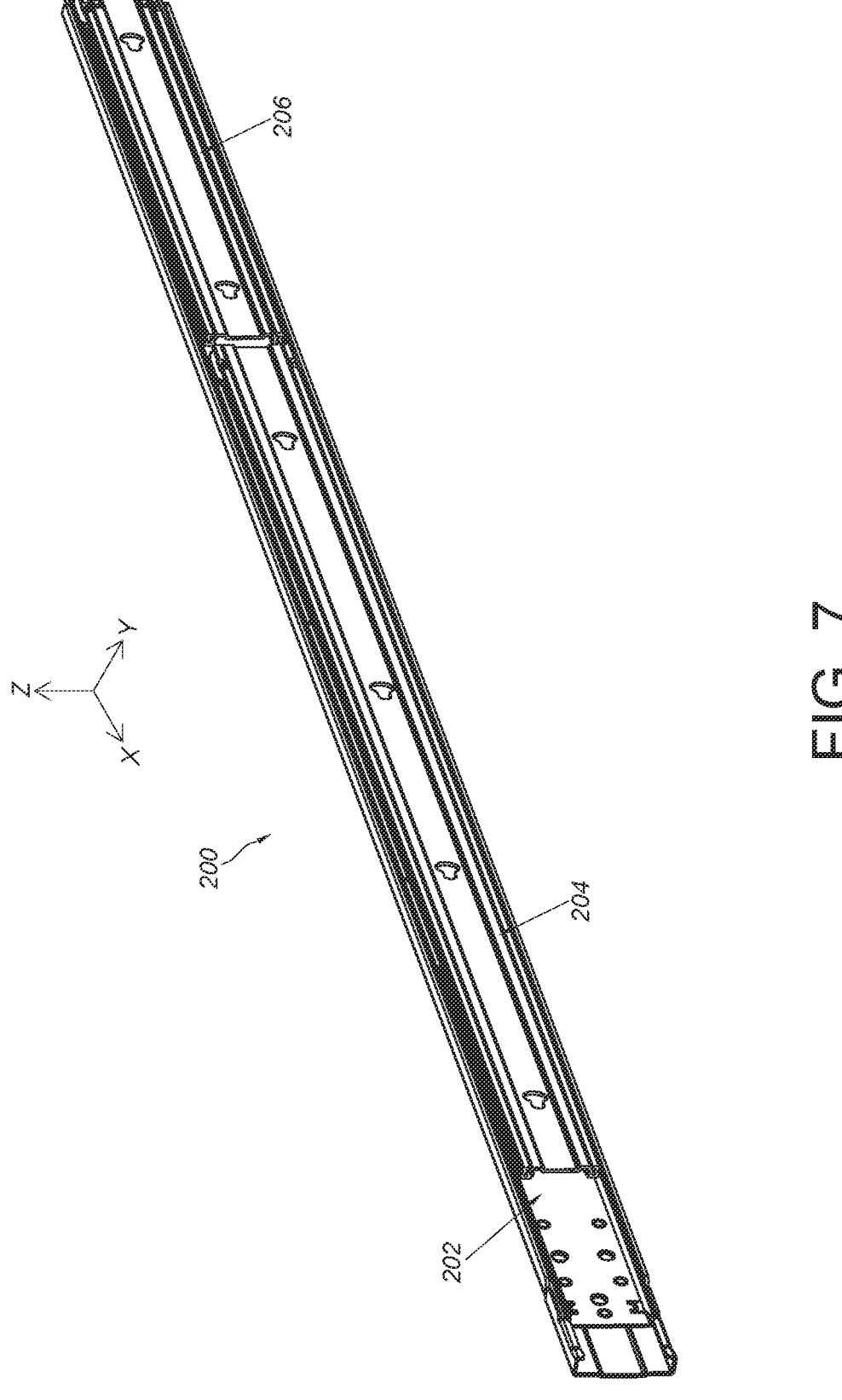
FIG. 7 is a diagram showing a slide rail assembly according to a second embodiment of the present invention.
Figure 8:
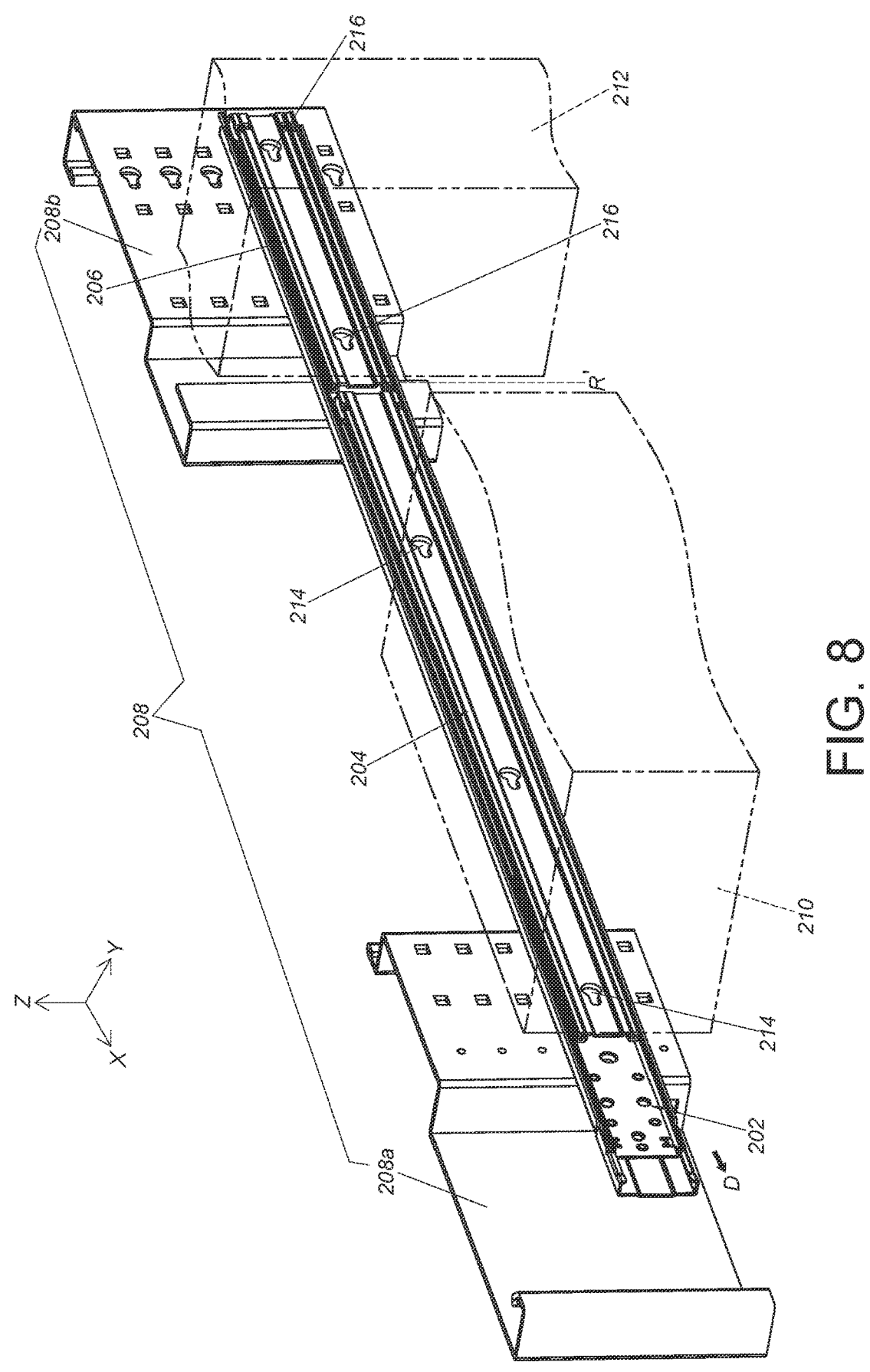
FIG. 8 is a diagram showing the slide rail assembly being mounted to a rack, and the slide rail assembly configured to carry two carried object according to the second embodiment of the present invention.

FIGS. 7 and 8 shows a slide rail assembly 200 according to a second embodiment of the present invention. Different from the slide rail assembly 20 in the first embodiment which comprises five slide rails (such as the first rail to the fifth rail), the slide rail assembly 200 in the second embodiment comprises three slide rails.

Specifically, the slide rail assembly 200 comprises an outer rail 202 and two inner rails, such as a first inner rail 204 and a second inner rail 206. The first inner rail 204 and the second inner rail 206 are movably mounted in the passage of the outer rail 202 and are longitudinally movable relative to the outer rail 202 respectively. The outer rail 202 is configured to be mounted to a rack 208. For example, the outer rail 202 is configured to be mounted to a front part 208*a* and a rear part 208*b* of the rack 208. The first inner rail 204 is configured to carry a first carried object 210, and the second inner rail 206 is configured to carry a second carried object 212. For example, the first inner rail 204 comprises at least one first connecting feature 214 configured to mount the first carried object 210, and the second inner rail 206 comprises at least one second connecting feature 216 configured to mount the second carried object 212. In addition, the first inner rail 204 and the second inner rail 206 have different longitudinal lengths corresponding to different longitudinal lengths of the first carried object 210 and the second carried object 212. In the present embodiment, the first inner rail 204 is longer than the second inner rail 206.

When the first carried object 210 is moved relative to the outer rail 202 through the first inner rail 204 along the opening direction D to an extended position to be detached, the second carried object 212 is movable relative to the outer rail 202 through the second inner rail 206 from a retracted position R' along the opening direction D to another extended position, such that it is convenient for the user to perform related maintenance on the second carried object 212. Such similar configurations are disclosed in the first embodiment, for simplification, no further illustration is provided.

Therefore, the slide rail assembly according to the embodiments of the present invention has the following technical features:

1. The slide rail assembly 20 comprises a plurality of slide rails, such as the first rail 22, the second rail 24, the third rail 26, the fourth rail 28 and the fifth rail 30. The first rail 22 can be regarded as an outer rail of the slide rail assembly 20, the second rail 24 and the third rail 26 can be regarded as two middle rails of the slide rail assembly 20, and the fourth rail 28 and the fifth rail 30 can be regarded as two inner rails of the slide rail assembly 20. In other words, the two middle rails (24, 26) with the two corresponding inner rails (28, 30) share the same outer rail 22. In addition, the slide rail assembly 200 comprises the outer rail 202 and two inner rails (204, 206) sharing the same outer rail 202. Therefore, in contrast to the slide rail assembly of the prior art, the connection configuration of the slide rails of the slide rail assembly provided by the embodiments of the present application is more innovative and capable of facilitating the use of at least two carried objects.

2. When the slide rail assembly (20,200) is mounted to the rack (62, 208), the two inner rails of the slide rail assembly (20, 200), such as the inner rail (28, 204) and the inner rail (30, 206), are configured to carry a first carried object (68, 210) and a second carried object (70, 212) respectively, and the inner rail (28, 204) with the first carried object (68,210) and the inner rail (30,206) with the second carried object (70, 212) can be opened and/or detached relative to the first rail (22, 202) respectively, such that it is convenient for the user to perform maintenance on the first carried object (68, 210) or the second carried object (70, 212).

3. The two inner rails of the slide rail assembly (20, 200), such as the inner rail (28, 204) and the inner rail (30, 206), have different lengths. Therefore, the two inner rails can correspondingly carry the carried objects, such as the first carried object (68, 210) and the second carried object (70, 212), with different lengths respectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail formed with a first passage;
a second rail and a third rail movably mounted in the first passage of the first rail, the second rail and the third rail formed with a second passage and a third passage respectively; and
a fourth rail and a fifth rail movably mounted in the second passage of the second rail and the third passage of the third rail respectively;
wherein the second rail is movable relative to the first rail along an opening direction to a first extended position, and the fourth rail is movable relative to the second rail along the opening direction to a second extended position;
wherein each of the first rail and the fourth rail has a front part and a rear part; wherein when the fourth rail is located at the second extended position, the front part of the fourth rail is extended beyond the front part of the first rail;
wherein when the fourth rail is moved from the second extended position along the opening direction to be detached, the third rail is movable relative to the first rail along the opening direction to a third extended position, and the fifth rail is movable relative to the third rail along the opening direction to a fourth extended position;
wherein the fifth rail has a front part and a rear part; wherein when the fifth rail is located at the fourth extended position, the front part of the fifth rail is extended beyond the front part of the first rail.

2. The slide rail assembly of claim 1, wherein the first rail comprises a first wall, a second wall and a longitudinal wall connected between the first wall and the second wall of the first rail, and the first passage is defined by the first wall, the second wall and the longitudinal wall of the first rail and configured to accommodate the second rail and the third rail.

3. The slide rail assembly of claim 2, wherein the second rail comprises a first wall, a second wall and a longitudinal wall connected between the first wall and the second wall of the second rail, and the second passage is defined by the first wall, the second wall and the longitudinal wall of the second rail and configured to accommodate the fourth rail.

4. The slide rail assembly of claim 3, wherein the third rail comprises a first wall, a second wall and a longitudinal wall connected between the first wall and the second wall of the third rail, and the third passage is defined by the first wall, the second wall and the longitudinal wall of the third rail and configured to accommodate the fifth rail.

5. The slide rail assembly of claim 1, wherein the second rail and the third rail have different lengths.

6. The slide rail assembly of claim 1, wherein the fourth rail and the fifth rail have different lengths.

7. A slide rail assembly, comprising:
a first rail;
a second rail and a third rail respectively movable relative to the first rail, each of the second rail and the third rail formed with a passage, and the passage of the second rail communicated and aligned with the passage of the third rail; and a fourth rail and a fifth rail configured to be accommodated in the passage of the second rail and the passage of the third rail respectively;
wherein the second rail is movable relative to the first rail along an opening direction to a first extended position, and the fourth rail is movable relative to the second rail along the opening direction to a second extended position;
wherein each of the first rail and the fourth rail has a front part and a rear part; wherein when the fourth rail is located at the second extended position, the front part of the fourth rail is extended beyond the front part of the first rail;
wherein when the fourth rail is moved from the second extended position along the opening direction to be detached, the third rail is movable relative to the first rail along the opening direction to a third extended position, and the fifth rail is movable relative to the third rail along the opening direction to a fourth extended position;
wherein the fifth rail has a front part and a rear part; wherein when the fifth rail is located at the fourth extended position, the front part of the fifth rail is extended beyond the front part of the first rail.

8. The slide rail assembly of claim 7, wherein the first rail comprises a first wall, a second wall and a longitudinal wall connected between the first wall and the second wall of the first rail, and a first passage is defined by the first wall, the second wall and the longitudinal wall of the first rail and configured to accommodate the second rail and the third rail.

9. The slide rail assembly of claim 8, wherein the second rail comprises a first wall, a second wall and a longitudinal wall connected between the first wall and the second wall of the second rail, and a second passage is defined by the first wall, the second wall and the longitudinal wall of the second rail and configured to accommodate the fourth rail.

10. The slide rail assembly of claim 9, wherein the third rail comprises a first wall, a second wall and a longitudinal wall connected between the first wall and the second wall of the third rail, and a third passage is defined by the first wall, the second wall and the longitudinal wall of the third rail and configured to accommodate the fifth rail.

11. A slide rail assembly, comprising:
a first rail formed with a first passage;
a second rail and a third rail movably mounted in the first passage of the first rail, the second rail and the third rail formed with a second passage and a third passage respectively; and
a fourth rail and a fifth rail movably mounted in the second passage of the second rail and the third passage of the third rail respectively;
wherein the second rail and the third rail have different lengths.

12. A slide rail assembly, comprising:
a first rail formed with a first passage;
a second rail and a third rail movably mounted in the first passage of the first rail, the second rail and the third rail formed with a second passage and a third passage respectively; and
a fourth rail and a fifth rail movably mounted in the second passage of the second rail and the third passage of the third rail respectively;
wherein the fourth rail and the fifth rail have different lengths.

* * * * *